(12) United States Patent
Jackson et al.

(10) Patent No.: US 6,333,563 B1
(45) Date of Patent: Dec. 25, 2001

(54) ELECTRICAL INTERCONNECTION PACKAGE AND METHOD THEREOF

(75) Inventors: Raymond A. Jackson, Fishkill; Anson J. Call; Mark G. Courtney, both of Poughkeepsie; Stephen A. DeLaurentis, Claverack; Mukta S. Farooq; Shaji Farooq, both of Hopewell Junction; Lewis S. Goldmann, Bedford; Gregory B. Martin; Sudipta K. Ray, both of Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/587,944

(22) Filed: Jun. 6, 2000

(51) Int. Cl.$^7$ .................................................. H01L 29/40
(52) U.S. Cl. ......................... 257/778; 257/686; 257/738; 361/779; 439/67
(58) Field of Search ................................... 257/778, 738, 257/737, 734, 663, 692, 779, 723, 686, 685, 668, 787, 771, 772, 703, 702, 777, 73, 794

(56) References Cited

U.S. PATENT DOCUMENTS

| 5,477,082 | 12/1995 | Buckley, III et al. | 257/679 |
| 5,530,288 | 6/1996 | Stone | 257/700 |
| 5,535,526 | 7/1996 | White | 34/78 |
| 5,598,033 | 1/1997 | Behlen et al. | 257/686 |
| 5,598,036 | 1/1997 | Ho | 257/738 |
| 5,636,104 | 6/1997 | Oh | 361/777 |
| 5,691,041 | 11/1997 | Frankeny et al. | 428/209 |
| 5,729,440 | * 3/1998 | Jimarez et al. | 361/779 |
| 6,102,710 | * 8/2000 | Beilin et al. | 439/67 |

FOREIGN PATENT DOCUMENTS

06350259-A  * 12/1994  (JP).

* cited by examiner

Primary Examiner—Nathan Flynn
Assistant Examiner—Remmon R. Fordé
(74) Attorney, Agent, or Firm—Margaret A. Pepper

(57) ABSTRACT

The present invention relates generally to an electrical interconnection package and a method thereof. More particularly, the invention encompasses an invention that increases the fatigue life of a Ball Grid Array (BGA) electrical interconnection. This invention structurally couples at least one module to an organic interposer using a high modulus underfill material. The organic interposer is then joined to a organic board using standard joining processes. The inventive module can then be removed from the organic board at any time by moving the organic interposer using standard rework techniques.

21 Claims, 1 Drawing Sheet

ELECTRICAL INTERCONNECTION PACKAGE AND METHOD THEREOF

FIELD OF THE INVENTION

The present invention relates generally to an electrical interconnection package and a method thereof. More particularly, the invention encompasses an invention that increases the fatigue life of a Ball Grid Array (BGA) electrical interconnection. This invention structurally couples at least one module to an organic interposer using a high modulus underfill material. The organic interposer is then joined to a organic board using standard joining processes. The inventive module can then be removed from the organic board at any time by removing the organic interposer using standard rework techniques.

BACKGROUND OF THE INVENTION

Ball Grid Arrays (BGA) are widely used to electrically and mechanically connect substrates (typically ceramic) carrying semiconductor chips to a card. The BGA commonly consists of an array of metal balls which are soldered to connecting pads on both the card and the substrate.

Typically, the card (which usually consists of an FR4 body material with internal copper wiring) will have a much greater coefficient of thermal expansion than will the ceramic substrate that it is attached to. Consequently, during operation, as the entire assembly becomes heated, there is a strain imposed upon the BGA connections due to these differential expansions of the card and substrate. With repeated on-off operating cycles, the BGA connections eventually fatigue and fail by creating an open circuit or a circuit of high resistance.

U.S. Pat. No. 5,535,526 (White), assigned to International Business Machines Corporation, Armonk, New York, the disclosure of which is incorporated herein by reference, teaches a chip connected to an organic chip carrier substrate via solder, and wherein the organic chip carrier substrate is connected to a circuit board via connect balls.

U.S. Pat. No. 5,691,041 (Frankeny), assigned to International Business Machines Corporation, Armonk, N.Y., the disclosure of which is incorporated herein by reference, teaches a chip connected to a printed circuit board via an interposer.

Therefore, there is a need in the art to have an interconnect package where a substrate secured to at least one chip, has at least one organic interposer secured to the substrate with at least one first interconnect material or a set of first interconnect materials and at least one organic board secured to an organic interposer using at least one second interconnect material or a set of second interconnect materials, wherein the first interconnect material or the set of first interconnect materials has an onset of melting that is substantially above the onset of melting of the second interconnect material or second set of materials. This is of course neither taught nor disclosed by the prior art.

PURPOSES AND SUMMARY OF THE INVENTION

The invention is a novel electrical interconnection package and a method thereof.

Therefore, one purpose of this invention is to provide a structure and a method for an electrical interconnection package.

Another purpose of this invention is to increase the fatigue life of a Ball Grid Array (BGA) electrical interconnection.

Still another purpose of this invention is to structurally couple at least one module to an organic interposer using a high modulus underfill material.

Yet another purpose of this invention is to join an organic interposer to an organic board.

Still yet another purpose of the invention is to be able to rework the inventive module by removing the organic interposer from the organic board.

Therefore, in one aspect this invention comprises a method of forming an interconnect package comprising the steps of:

(a) securing at least one first interconnect material to a substrate having a chip secured thereto, (b) securing an organic interposer to said substrate via said first interconnect material, and (c) securing an organic board to said organic interposer via at least one second interconnect material, and thereby forming said interconnect package.

In another aspect this invention comprises an interconnect structure comprising, a substrate secured to at least one chip, at least one organic interposer secured to said substrate with at least one first interconnect, and at least one organic board secured to said at least one organic interposer using at least one second interconnect.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
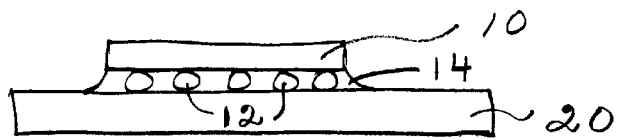
FIG. 1, illustrates a conventional chip secured to a substrate.

FIGS. 1 through 4, illustrate one preferred embodiment. Specifically, FIG. 1, shows a conventional chip 10, that is secured to a substrate 20, using at least one solder ball 12. For most applications it is preferred that the area between the underside of the chip 10, and the corresponding surface on the substrate 20, is filled with at least one underfill material 14. The substrate 20, could be selected from a group consisting of ceramic, glass ceramic and multi-layer ceramic.

Figure 2:
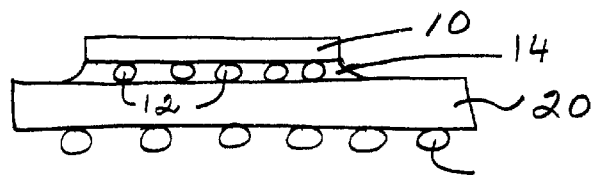
FIG. 2, illustrates the securing of a first interconnect material or a set of first interconnect materials to the substrate of FIG. 1.

FIG. 2, illustrates the securing of at least one first interconnect material or a set of first interconnect materials 22, to the underside of the substrate 20. The first interconnect material 22, could be a single melt solder alloy material 22, such as, preferably a 95 Sn/5 Sb material having a melting point of between about 232 to about 242° C. The first interconnect material 22, could be a single melt solder ball material 22, preferably having an average diameter of between about 0.020 to about 0.035 inches. The smaller the ball 22, the less underfill that will be required, and thus less cost to produce. Additionally, the smaller the ball 22, the less inductance the circuit will see.

Figure 3:
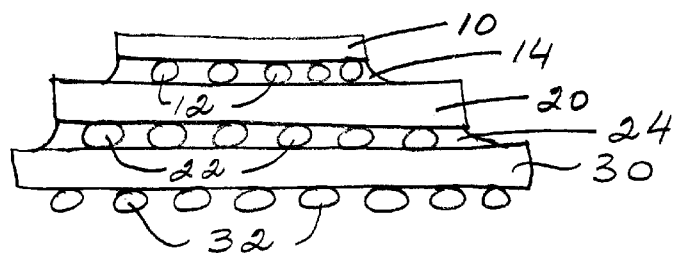
FIG. 3, illustrates the securing of an organic interposer to the first interconnect material of FIG. 2.

FIG. 3, illustrates the securing of an organic interposer 30, to the single melt material 22. Basically, the substrate 20, having the first interconnect material 22, is attached to the top side of the interposer 30, by using the first interconnect material 22, such as, a single melt solder alloy material 22.

The organic interposer 30, is preferably fabricated from a material which has an expansion coefficient similar to an organic board or card that it will be attached to, and may even be made of FR4 itself. The thickness of the organic interposer 30, is preferably in the range of between about 1.5 to about 3 mm. The exposed area between interposer 30, and the substrate 20, can optionally be filled with at least one underfill 24, with a proprietary or a commercially available high modulus material, typically on the order of 8 GPa, such as, commercially available Hysol 4526 from Dexter, or a commercially available 8800 series underfill from Johnson Mathey. The underfill 24, structurally couples the substrate 20, to the interposer 40, limiting its ability to freely expand.

A second interconnect material or a set of second interconnect materials 32, such as, a dual melt solder ball structure 32, can now be joined to the bottom side of the organic interposer 30. As one can see that the substrate 30, is now attached, and the optional underfilled 24, is on the top side/surface of the organic interposer 30. The solder balls 32, are of a higher melting temperature, such as, 90 Pb/10 Sn which has a melting point of about 300° C. The 90 Pb/10 Sn solder balls 32, are attached to the bottom side of the organic interposer 30, using at least one low melt 63 Sn/137 Pb eutectic which melts at about 183° C., as the fillet material 24. Thus, a temperature hierarchy has been employed such that upon joining the 90 Pb/10 Sn balls 32, to the bottom side of the organic interposer 30, with a low melting fillet material 24, the higher melting 95 Sn/5 Sb balls 24, which joined the substrate 20, to the organic interposer 30, and were subsequently underfilled, i.e., never became liquefied.

Figure 4:
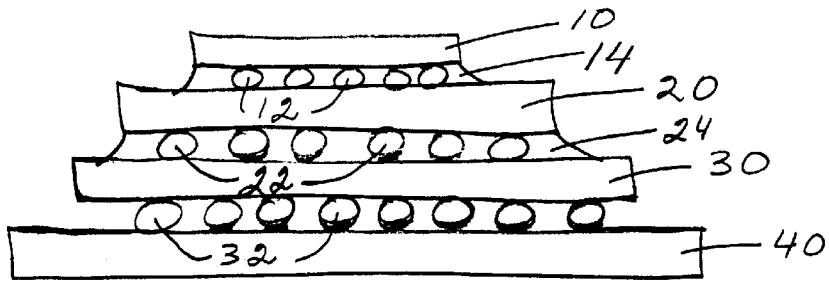
FIG. 4, illustrates the securing of an organic board to the organic interposer using a second interconnect material or a set of second interconnect materials.

FIG. 4, illustrates the securing of an organic board 40, to the organic interposer 30, using the dual melt material 32. The underfilled substrate 20, with solder balls 22, on the bottom surface of the organic interposer 30, is then joined to the organic card or board 40, such as, an FR4 board. The thermal coefficient of expansion of the organic interposer 30, now exactly or very closely matches that of the FR4 board 40, that it was attached to. Thus, the joints between the organic interposer 30, and FR4 board 40, do not incur a mismatched TCE induced expansion and therefore are subject to lower shear strain. Since the underfill 24, has structurally coupled the substrate 20, to the organic interposer 30, there is less strain, a portion of which must be borne by the joints interconnecting the substrate to the interposer. Thus, the organic interposer 30, achieves a fatigue lifetime enhancement of between 3 times to at least 5 times as compared to not using this structure.

Standard rework processes can be used to remove the organic interposer 30, from the FR4 board 40. This allows non-reworkable underfills to be employed, yet allows rework of the substrate/interposer module from the organic card 40.

It is preferred that the organic interposer 30, is an FR4, however, it should be understood that the organic interposer 30, could be made of any material that closely matches the CTE of the organic board 40, that it is being joined to.

With the electronics industry moving to Pb free components, it should be understood that the materials discussed with reference to this invention are merely examples of the elements and alloys which could be used in this invention, but are not limited to those specified.

As stated earlier, a key aspect of this invention is that the first interconnect material or the set of first interconnect materials 22, which joins the substrate 20, to the interposer 30, does not melt either when the second interconnect material or set of second interconnect materials 32, are joined to the bottom side of the interposer 30, or when the interposer 30, is joined to the FR4 board 40. This is because the melting would cause a large volume expansion and outward pressure, thus popping off the substrate 20, from the interposer 30, or causing an underfill separation. Therefore, maintaining this temperature hierarchy is very important, or alternatively, the amount of first interconnect material 22, which may become molten between the substrate 20, the interposer 30, should be very minimal to prevent the popping off of the substrate 20, as would happen with a large volume of liquified material 22.

In another embodiment, the substrate 20, could be attached to the interposer 30, by means of at least one high melt, non-solder metal ball or metal column 22, such as, Cu 22. The Cu ball or column 22, would be joined to the substrate 20, and to the interposer 30, by means of a fillet material. The fillet material, such as, a 95 Sn/5 Sb would be a very low volume and thin interface. That fillet material would be allowed to be molten after underfill because the volume is so small. There would be minimal volume expansion and no separation from the underfill material would occur. Using this embodiment, small diameter columns 22, could be used to allow for fine pitch applications. Additionally, since the solder alloy used in the preferred embodiment is limited by the maximum allowable reflow temperature that the interposer 30, can sustain, this method would allow the use of extremely high melting metals well beyond the range of the interposer 30.

However, for some applications the copper ball or copper column could be plated with at least one layer of nickel as a diffusion barrier layer and maybe followed by at least one layer of tin as an overplate. This could also be in conjunction with a tin-rich joining alloy, such as, Sn/Ag/Cu, Sn/Sb, to name a few. This kind of scheme will ensure that even if the final reflow for attaching the assembly, comprising of the substrate, organic interposer and the underfill, to the organic card sees a peak temperature of about 245° C., there will be only a slight melting of the interface joining alloys and no melting of the copper ball or column.

The first interconnect material 22, could be preferably selected from a group consisting of Cu, Sn, Sn/Pb, Sn/Ag, Sn/Sb, alloys of Sn and Cu alloys. While, the interconnect material 32, is preferably selected from a group consisting of Sn, Sn/Pb, Sn/Ag, Sn/Sb and alloys of Sn.

However, it is preferred that the onset of melting for the first interconnect material 22, is higher than the onset of melting of the second interconnect material 32. For most applications the melting onset for the first interconnect material 22, is at least 25° C. higher than the melting range of the second interconnect material 32. The melting points for the first and the second interconnect material could be in the range of between about 100° C. and about 1,200° C.

The first and/or the second interconnect material could be a ball or a column. If it is a column then the height of the column is preferably in the range of between about 0.020 to about 0.150 inches. And, whereas the diameter of the first and/or second interconnect could preferably in the range of between about 0.005 to about 0.025 inches. Furthermore, the size of the first and/or the second interconnect is preferably in the range of between about 0.020 to about 0.035 inches.

The organic interposer 30, or the organic board 40, could be selected from a group consisting of FR4, FR4 with surface laminar circuits (SLC) or organic chip carrier with at least one metal and at least one polyimide layer. For most applications the organic interposer 30, has a thickness which is preferably in the range of between about 1.5 to about 3.0 mm.

As stated earlier that this invention prevents any delamination or cracking of the underfill due to severe hydrostatic pressure exerted by the volume expansion of the balls enclosed in the underfill. Such delamination has been seen in chips first joined with eutectic Sn/Pb solder and subsequently subjected to a reflow temperature of between about 210 to about 220° C., during which step the C4 interconnection had completely melted. The underfill that is injected into the package could be at least one high modulus filled epoxy.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An interconnect structure comprising, a substrate secured to at least one chip, at least one organic interposer secured to said substrate with at least one first interconnect, and at least one organic board secured to said at least one organic interposer using at least one second interconnect.

2. The interconnect structure of claim 1, wherein at least one first underfill is injected into said package between said substrate and said organic interposer.

3. The interconnect structure of claim 1, wherein said at least one first interconnect material has an onset of melting that is higher than the onset of melting of said at least one second interconnect material.

4. The interconnect structure of claim 1, wherein the melting onset for said first interconnect material is at least 25° C. higher than the melting range of said second interconnect material.

5. The interconnect structure of claim 1, wherein the melting point of said first interconnect material is preferably in the range of between about 100° C. and about 1,200° C.

6. The interconnect structure of claim 1, wherein the melting point of said second interconnect material is preferably in the range of between about 100° C. and about 1,200° C.

7. The interconnect structure of claim 1, wherein at least one first underfill is injected into said package between said substrate and said organic interposer, and wherein said first underfill material is at least one high modulus filled epoxy.

8. The interconnect structure of claim 1, wherein said first interconnect material is selected from a group consisting of Cu, Sn, Sn/Pb, Sn/Ag, Sn/Sb, alloys of Sn and Cu alloys.

9. The interconnect structure of claim 1, wherein said second interconnect material is selected from a group consisting of Sn, Sn/Pb, Sn/Ag, Sn/Sb and alloys of Sn.

10. The interconnect structure of claim 1, wherein said first interconnect material is selected from a group consisting of ball and column.

11. The interconnect structure of claim 10, wherein height of said column is preferably in the range of between about 0.020 to about 0.150 inches.

12. The interconnect structure of claim 1, wherein diameter of said first interconnect is preferably in the range of between about 0.005 to about 0.025 inches.

13. The interconnect structure of claim 1, wherein said second interconnect material is selected from a group consisting of ball and column.

14. The interconnect structure of claim 13, wherein height of said column is preferably in the range of between about 0.020 to about 0.150 inches.

15. The interconnect structure of claim 1, wherein diameter of said column is preferably in the range of between about 0.005 to about 0.025 inches.

16. The interconnect structure of claim 1, wherein said organic interposer is selected from a group consisting of FR4, FR4 with surface laminar circuits (SLC) or organic chip carrier with at least one metal and at least one polyimide layer.

17. The interconnect structure of claim 1, wherein said organic board is selected from a group consisting of FR4, FR4 with surface laminar circuits (SLC) or organic chip carrier with at least one metal and at least one polyimide layer.

18. The interconnect structure of claim 1, wherein the size of said first interconnect material is preferably in the range of between about 0.020 to about 0.035 inches.

19. The interconnect structure of claim 1, wherein the size of said second interconnect material is preferably in the range of between about 0.020 to about 0.035 inches.

20. The interconnect structure of claim 1, wherein the thickness of said organic interposer is preferably in the range of between about 1.5 to about 3.0 mm.

21. The interconnect structure of claim 1, wherein material for said substrate is selected from a group consisting of ceramic, glass ceramic and multi-layer ceramic.

* * * * *